(12) United States Patent  
Douskey et al.

(10) Patent No.: US 6,448,835 B1
(45) Date of Patent: Sep. 10, 2002

(54) HIGH-SPEED LEAF SPLITTER FOR CLOCK GATING

(75) Inventors: Steven Michael Douskey; Bruce George Rudolph, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/947,602

(22) Filed: Sep. 6, 2001

(51) Int. Cl.[7] .................................................. G06F 1/04
(52) U.S. Cl. ........................................ 327/295; 327/176
(58) Field of Search .................................. 327/166, 176, 327/239, 245, 247, 251, 253, 257–259, 291–293, 295

(56) References Cited

U.S. PATENT DOCUMENTS

| | | | | |
|---|---|---|---|---|
| 5,852,378 A | * | 12/1998 | Keeth .......................... | 327/161 |
| 5,867,453 A | * | 2/1999 | Wang et al. ................. | 327/239 |
| 5,923,613 A | * | 7/1999 | Tien et al. ................... | 327/261 |
| 5,949,266 A | * | 9/1999 | Hinds et al. ................. | 327/208 |
| 5,977,809 A | * | 11/1999 | Wang et al. ................. | 327/239 |

* cited by examiner

Primary Examiner—My-Trang NuTon
(74) Attorney, Agent, or Firm—Bracewell & Patterson, LLP (57) ABSTRACT

An apparatus and method for providing a gated output timing signal within a gated clock distribution tree. In accordance with the present invention, a gated clock splitter includes a timing signal input and a combinatorial logic block coupled to the timing signal input that generates a gated timing signal. A gating signal input is coupled to the combinatorial logic block for selectively enabling and disabling the output from the combinatorial logic block. A gate control circuit is coupled to the gating signal input for providing a gate signal to the combinatorial logic block, wherein the gate control circuit provides a full-cycle path for said gate signal to the gating signal input.

15 Claims, 10 Drawing Sheets

HIGH-SPEED LEAF SPLITTER FOR CLOCK GATING

BACKGROUND OF THE INVENTION

1. Technical Field

The present invention relates in general to clocked microelectronic circuits, and in particular to a method and system for synchronously gating clock distribution trees. Still more particularly, the present invention relates to a system and method for providing two separately gated true and complementary clock signals at clock distribution tree leaves.

2. Description of the Related Art

Figure 2:
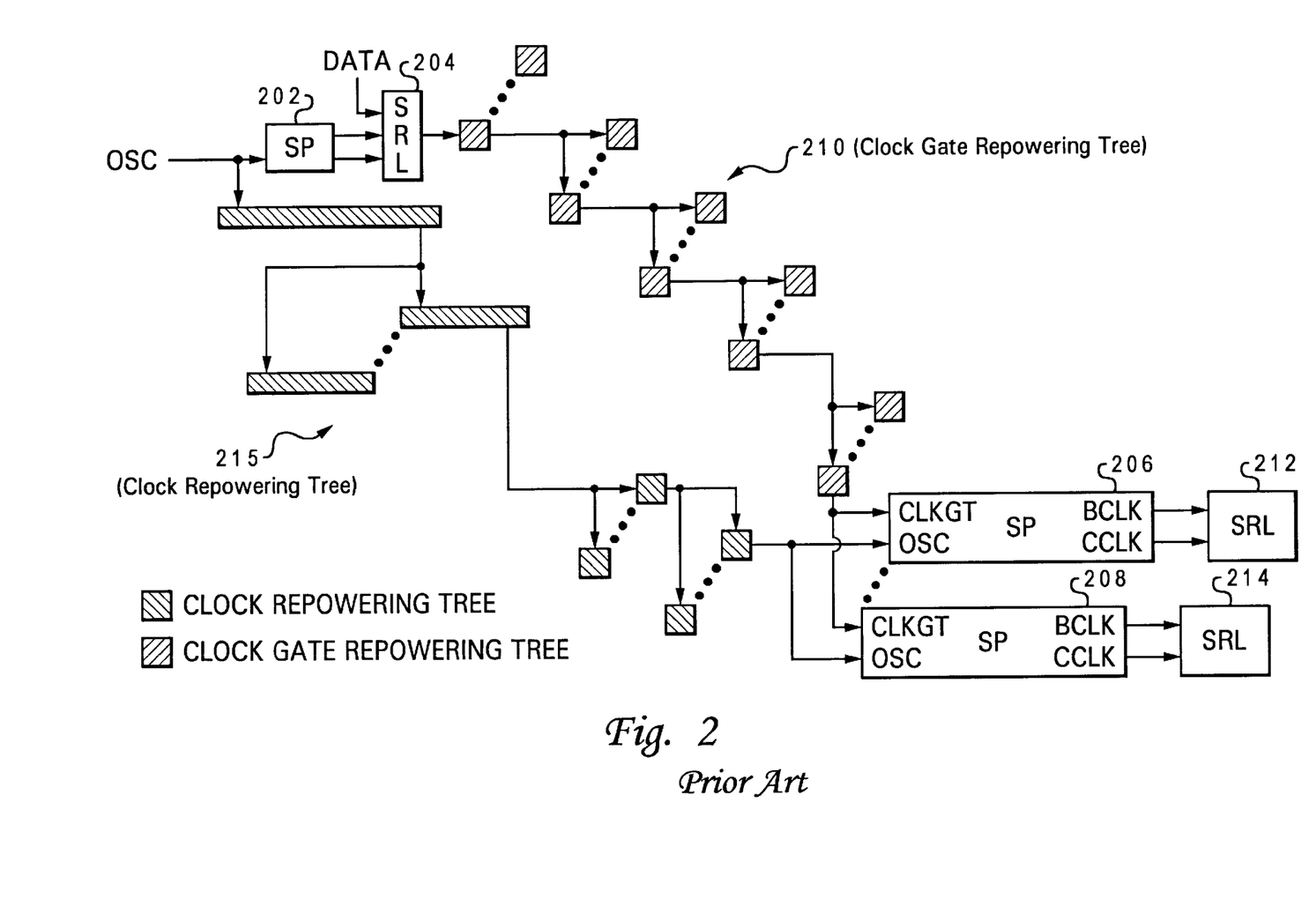
FIG. 2 depicts a clock repowering tree and a clock gate repowering tree in accordance with the prior art.

The clock distribution system within a digital electronic system is typically organized as a tree structure as depicted in FIG. 2. The tree structure depicted therein shows a clock repowering tree 215 and a clock gate repowering tree 210 in accordance with the prior art. A unique clock source, OSC, is the root of the tree. Every node of the tree branches to a fixed number of successor nodes. This number is called the branching factor. Every node of the clock distribution tree depicted in FIG. 2 either has a non-zero number of successor nodes (i.e., an internal node), or does not have any successors at all (i.e., an external node). In the latter case, the node is a leaf of the tree.

In the clock tree distribution structure depicted in FIG. 2, the leaf nodes are shift register latches including SRL 212 and SRL 214. SRLs comprise concatenated L1-L2 latch pairs having a design and functionality well known to those skilled in the art. SRLs 212 and 214 each require a dual, 180 degrees out-of-phase clock input for its L1/L2 latch pair. In the depicted example, clock splitters 206 and 208 provide such complementary clock signals for SRLs 212 and 214, respectively.

The tree distribution structure illustrated in FIG. 2, provides clock signals to registers and follows a set of design rules different from those of any other network in a design. For most designs, this network must be constructed such that the clocking signals arrive at each register at roughly the same time, that is to say, with minimum skew. This is typically accomplished by building clock repowering tree 215 such that it has an equal number of levels between the source clock OSC and all it sinks. In addition, the loading of each cell of a given level of each repowering structure should be equal to the loading of all other cells at the same level. The aim of such design strategy is to ensure that the paths through the repowering structures are subject to the same amount of delay from clock source to sink, resulting in minimum skew of the arrival time of clocking signals from register to register.

Clock gate repowering tree 210 provides a balanced power up and power down capability for clock gating circuits. As illustrated in FIG. 2, clock gate repowering tree 210 includes a clock splitter 202 that converts a timing signal from OSC into a complementary pair of timing signals for the L1/L2 latch pair within a shift register latch (SRL) 204. The gate signals provided by the clock gating circuits are utilized to selectably enable and disable the BCLK and CCLK clock signals at the outputs of clock splitters 206 and 208. To this end, a BCLKGT signal and a CCLKGT signal are generated within SRL 204 in accordance with a data input signal into SRL 204. The data signal into SRL 204 ideally provides synchronous control of the power up and power down of the circuitry supported by clock repowering tree 215 and clock gate repowering tree 210.

Figure 1:
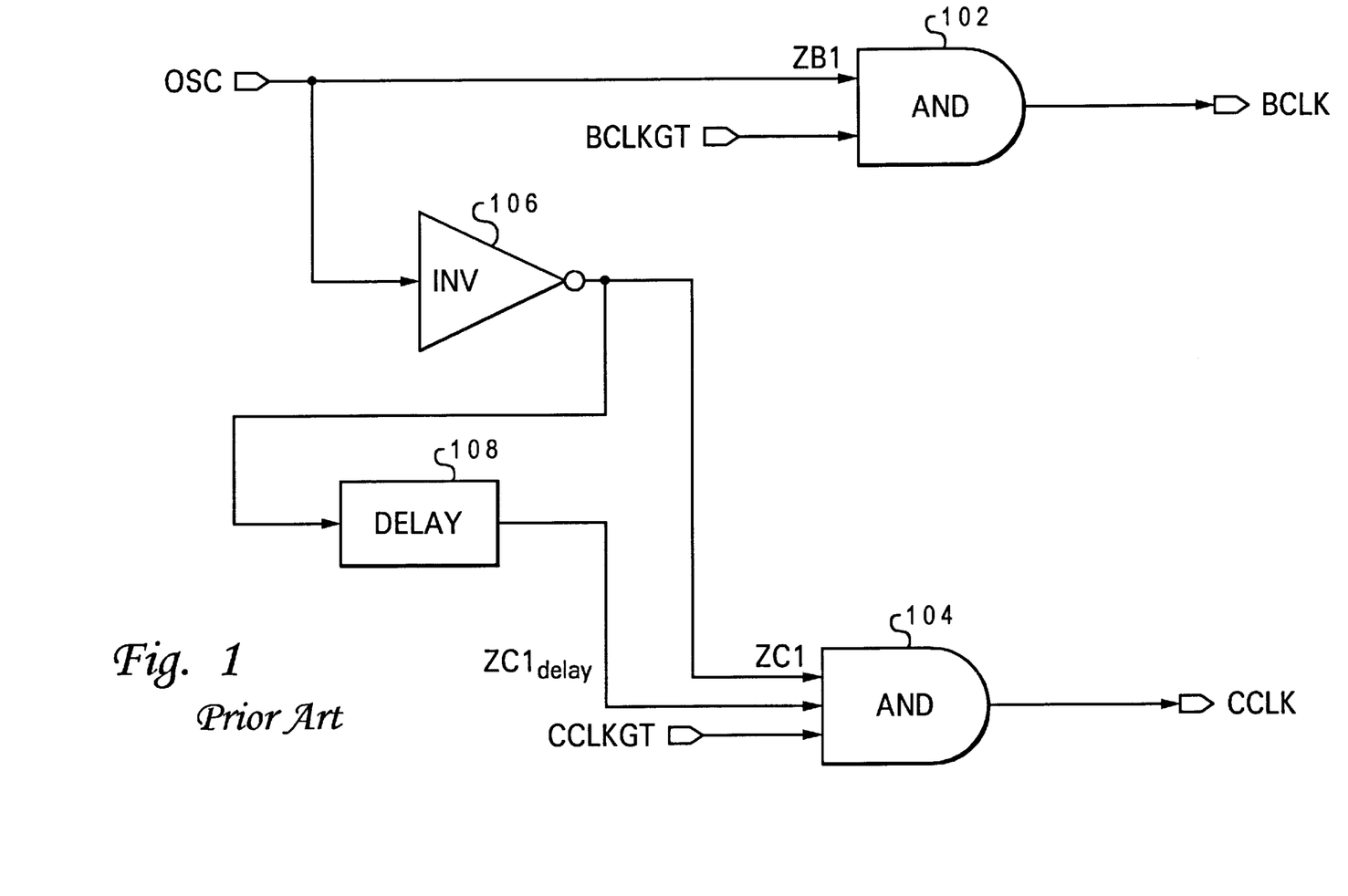
FIG. 1 illustrates a conventional gated clock splitter circuit.

Referring to FIG. 1, there is illustrated a conventional gated clock splitter circuit such as maybe implemented as clock splitter 206 or clock splitter 208. The clock splitter circuit depicted in FIG. 1 includes source timing input, OSC, and the gate signals BCLKGT and CCLKGT delivered from SRL 204. BCLKGT and CCLKGT control gate the BCLK and CCLK splitter outputs, respectively, which are delivered as the final latch control signals for the L1/L2 latch pairs within SRLs 212 and 214. The clock splitter circuit further includes an inverter 106 and a delay element 108 from which complementary gated output CCLK is generated in conjunction with gate signal CCLKGT. Gated timing signals BCLK and CCLK are formed to satisfy the timing requirements of functional on-chip SRLs at the leaves of the clock distribution tree depicted in FIG. 2. Controlling or gating timing signals BCLK and CCLK is the typical method used to synchronously start and stop the functional on-chip SRLs such as SRLs 212 and 214.

As illustrated in FIG. 2, the root for both clock repowering tree 215 and clock gate repowering tree 210 is system clock input OSC. The clock or timing signal provided at system clock input OSC is a single-phase clock signal that is distributed from a chip central clock buffer (not depicted) to all latches inside the macros in which clock repowering tree 215 and clock gate repowering tree 210 are distributed. The clock signal provided by OSC passes through clock repowering tree 215 until it reaches the leaf nodes including leaf node SRLs 212 and 214 via multiple clock splitters including clock splitters 206 and 208.

Figure 3:
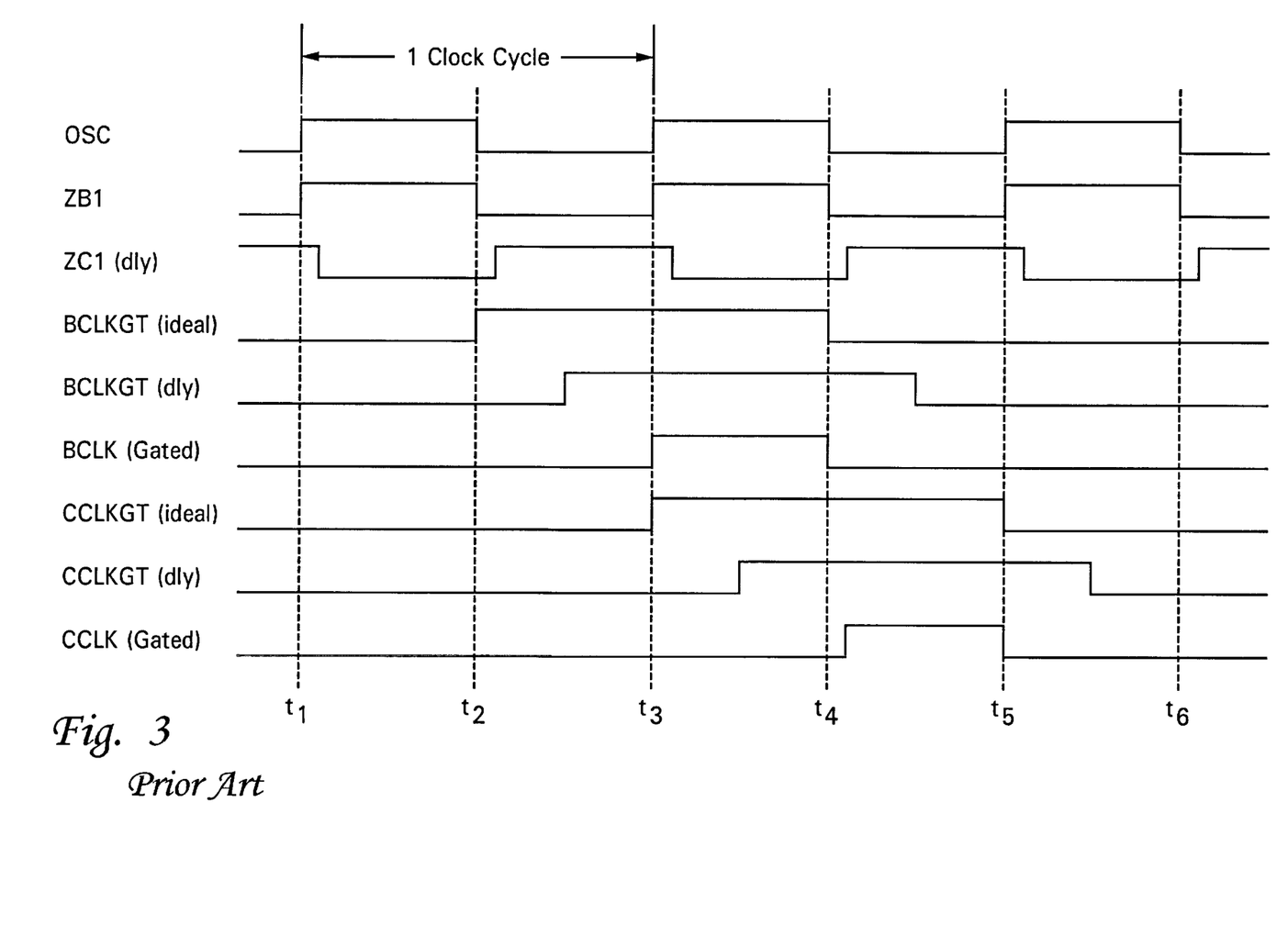
FIG. 3 is a timing diagram illustrated the operation of the gated clock splitter circuit in FIG. 1.

Enabling the circuitry supported by clock repowering tree 215 to start and stop the latches in a particular sequence facilitates debugging of logic functions in the lab and self-testing the logic at functional speed to test for AC (performance) defects. To this end, it is important that the SRLs at the leaves of the clock distribution tree are started and stopped synchronously. The gated clock splitter/distribution designs illustrated in FIGS. 1 and 2 have an inherently limited high-frequency performance due to a lack of clock distribution tracking and half-cycle gating paths. Referring to FIG. 2, a half-cycle path begins at the output of SRL 204 and ends at the BCLKGT and CCLKGT inputs into splitters 206 and 208. The timing signal input into splitter 202 and SRL 204 does not track its counterpart at the inputs of splitters 206 and 208 well enough for higher frequency operation. FIG. 3 depicts a timing diagram illustrating the operation of a gated clock splitter circuit such as gated clock splitter 206 or 208. To ensure synchronous switching, the BCLKGT and CCLKGT signals generated by clock splitter 202 and SRL 204 must arrive at splitters 206 and 208 within a half-cycle so that all of the latches supported by clock repowering tree 215 and clock gate repowering tree 210 start on the same clock cycle and are not chopped or slivered (depending on whether the latches are gated on or off). The sheer number of levels and branches within the clock distribution tree result in the half-cycle timing requirement that becomes problematic for high-frequency operations.

It can therefore be appreciated that a need exists for an improved high-speed gated clock splitter for use in clock distribution and repowering trees. The present invention addresses such a need.

SUMMARY OF THE INVENTION

An apparatus and method for providing a gated output timing signal within a gated clock distribution tree are disclosed herein. In accordance with the present invention, a gated clock splitter includes a timing signal input and a combinatorial logic block coupled to the timing signal input that generates a gated timing signal. A gating signal input is coupled to the combinatorial logic block for selectively enabling and disabling the output from the combinatorial logic block. A gate control circuit is coupled to the gating signal input for providing a gate signal to the combinatorial logic block, wherein the gate control circuit provides a fall-cycle path for the gate signal to said gating signal input.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

This invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

As described with reference to the figures, a circuit for providing a more stable gated output timing signal is disclosed herein. The circuit includes a timing signal input and gating logic that gates a timing signal generated from the timing signal input, wherein the gating logic includes a gating signal input. In an important feature of the present invention, circuit means are utilized to apply a gate signal to said gating logic, wherein the circuit means provides a full-cycle rather than a half-cycle path for the gate signal to the gating signal input. As utilized herein, a half-cycle timing path refers to a signal path that begins on a given reference clock transition (either a rising or a falling clock transition) and ends (is "captured") on the opposite reference clock transition (either a falling or a rising transition respectively) one half of a clock period (cycle) later. Half-cycle timing paths may be subject to additional timing tolerances caused by asymmetric (duty cycle) specifications of the reference clock and half-cycle jitter specifications.

A full-cycle timing path, as utilized herein, is one that is launched on one reference clock transition (either a rising or a falling clock transition) and captured (ended) on the same reference clock transition (a rising or falling transition, respectively) one full clock period (cycle) later. Full-cycle timing paths may be subject to additional timing tolerances imposed by frequency (accuracy) specifications of the reference clock and full-cycle jitter specifications.

Figure 4A:
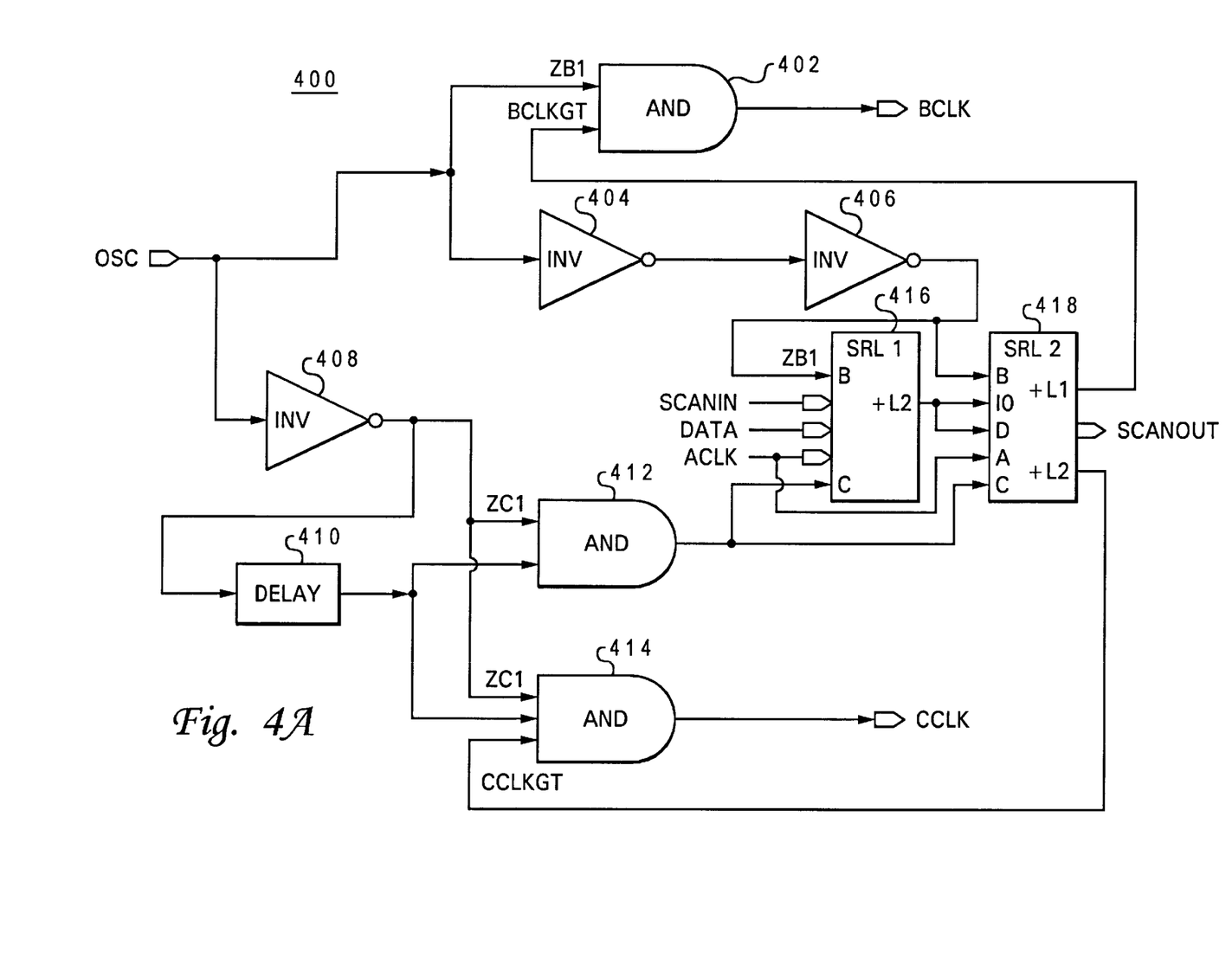
FIG. 4A depicts a circuit for providing a first gated output timing signal in accordance with a first embodiment of the present invention.

With reference to FIG. 4A, there is depicted a gated clock splitter circuit 400 for providing a first gated output timing signal sequence in accordance with a first embodiment of the present invention. In an important feature of the present invention, a common OSC input feeds both the clock splitter that is utilized to generate the timing s signals for clock gate formation as well as the splitter that clocks the functional SRLs. As illustrated in FIG. 4A, timing signal (clock) input, OSC, delivers a clock signal to an inverter 408, resulting in a complementary pair of clock signals, ZB1 and ZC1. In accordance with the depicted embodiment, the latches in the design supported by gated clock splitter 400 employ a level sensitive scan design (LSSD) that are fully scannable. A SCANIN input, an ACLK scan clock input, and a SCANOUT output enable the design to be LSSD-compatible. Alternatively, these latches may be non-scannable and still functionally meet the performance requirement.

Complementary clock signals ZB1 and ZC1 are applied as inputs to a combinatorial logic block comprising an AND gate 402 and an AND gate 414, wherein ZB1 and ZC1 are gated with respect to a pair of gate signals from gating inputs BCLKGT and CCLKGT, respectively. The gated output signals, BCLK and CCLK, from AND gates 402 and 414, respectively, are utilized as latch control (clock) signals for functional (non-gating) SRLs. Although AND gates are depicted as the gating logic for gated clock splitter 400, alternative types of logic gates such as NAND gates may be employed to serve the same gating function without departing from the spirit or scope of the present invention.

In accordance with the embodiment depicted in FIG. 4A, gated clock splitter circuit 400 further includes a pair of serially-coupled SRLs 416 and 418 that together generate gating signals BCLKGT and CCLKGT, which gate the outputs of AND gates 25 402 and 414, respectively. In contrast to conventional clock distribution trees wherein the gate signals are produced immediately subsequent to the clock source input from which they must track the original clock input through multiple levels and branches, SRLs 416 and 418 generate gate signals BCLKGT and CCLKGT immediately preceding the leaf nodes (i.e., SRLs 612 and 614 depicted in FIG. 6). In a preferred embodiment of the present invention, the circuit means that generate the gate signals applied to the BCLKGT and CCLKGT inputs are embedded within gated clock splitter 400 as a pair of S serially coupled SRLs 416 and 418.

Although not explicitly depicted, it is assumed herein that SRLs 416 and 418 each comprise a pair of concatenated latches (an L1/L2 latch pair) wherein the capture latch (i.e., latch L1) receives the external data input (i.e. DATA input to SRL 416 and D input to SRL 418) and internally passes the data to the input of the release latch (i.e., latch L2), and the release latch provides the SRL data output. As illustrated in FIG. 4A, SRL 416 receives a clock input signal ZB1 at control input B and an inverted and mutually delayed clock signal ZC1 at control input C. A delay device 410, in combination with an AND gate 412, is utilized to impart a delay to the inverted clock signal from the output of an inverter 408 such that appropriate clock separation required to achieve synchronized timing is provided to the L1/L2 latch pairs within each of SRLs 416 and 418. A DATA input into SRL 416 provides the synchronized gate signal that is shifted within SRLs 416 and 418 to produce shifted gate signals BCLKGT and CCLKGT.

Figure 5A:
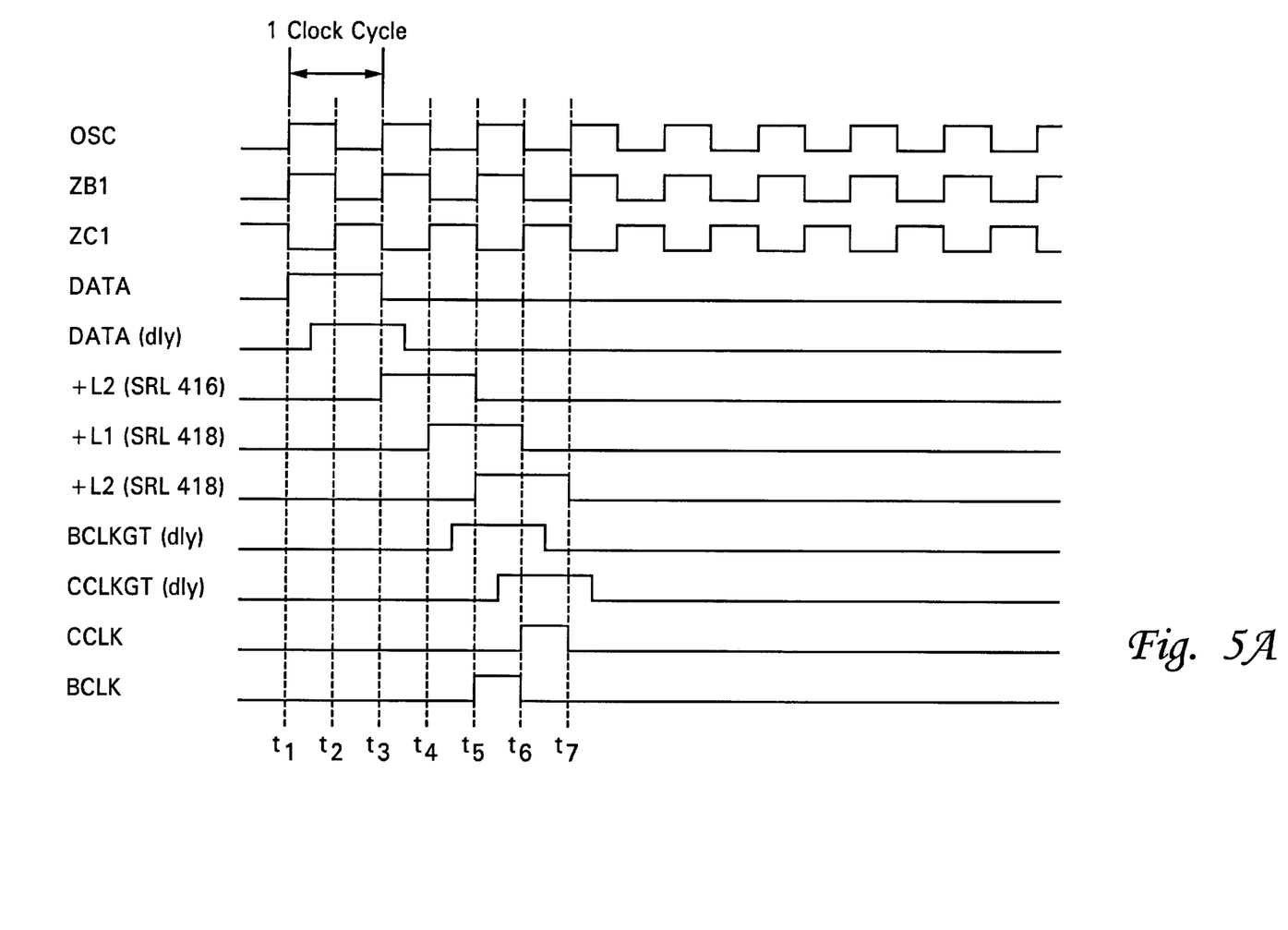
FIG. 5A is a timing diagram illustrating the operation of the gated clock splitter circuit in FIG. 4A.

Referring to FIG. 5A, the clocked L1/L2 operation of SRLs 416 and 418 is illustrated in a timing diagram showing the operation of the gated clock splitter circuit in FIG. 4A. It should be noted that, in the interest of clarity of explanation, the effects of the delay imparted by inverter 408 are not depicted in the timing diagram of FIG. 5A. It will thus be assumed with respect to the description of FIG. 5A that the ZC1 clock input to SRLs 416 and 418 is not appreciably delayed with respect to OSC. In response to the rising edge of ZC1 at time $t_2$, DATA is loaded into the L1 latch of SRL 416. Proceeding one half clock cycle to time $t_3$, DATA is transferred into the L2 latch of SRL 416. As depicted by the transition of the L1 output of SRL 418 at time $t_4$, the transfer of DATA from the L2 latch output of SRL 416 to the L1 input of SRL 418 is a half-cycle transfer.

Figure 6:
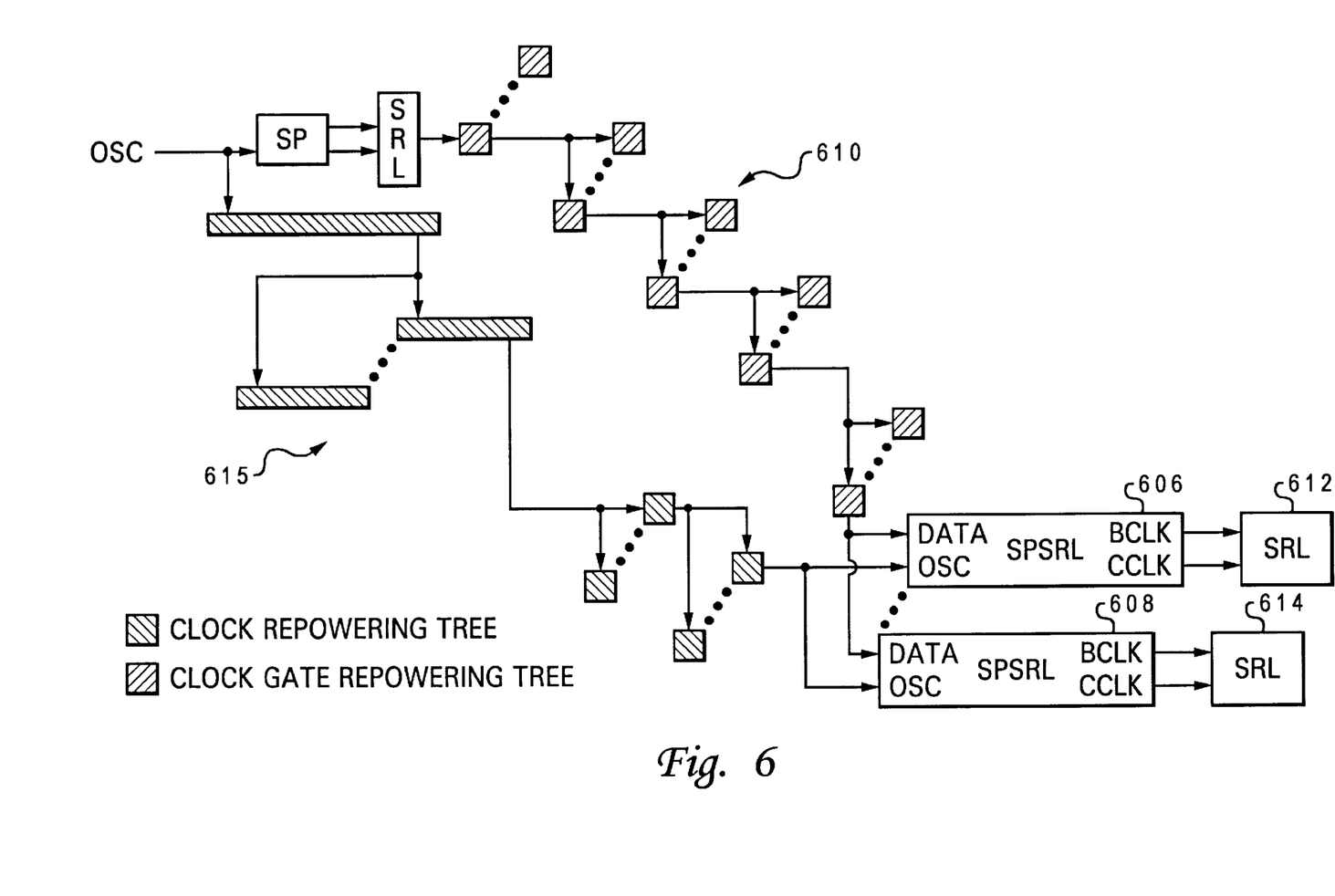
FIG. 6 depicts a clock repowering tree and a clock gate repowering tree in accordance with a preferred embodiment of the present invention.

Two other half-cycle transfers occur between times $t_4$ and $t_5$ and $t_5$ and $t_6$ for the transfer of DATA from the L1 output of SRL 418 to the BCLKGT input of AND gate 402, and the transfer of DATA from the L2 output of SRL 418 to the CCLKGT input of AND gate 414, respectively. The half-cycles paths for gate signals BCLKGT and CCLKGT are thus incorporated internally within gated clock splitter 400, providing superior clock distribution tracking for a clock distribution tree, and eliminating an otherwise extended half-cycle path through the entire clock gate repowering tree which is detrimental at higher frequencies. Gated clock splitter circuit 400 thus replaces the half-cycle clock gating timing requirements from time $t_2$ to $t_3$ (compare the analogous half-cycle requirement for BCLKGT to reach splitters 206 and 208 in FIG. 3), with a full-cycle ($t_1$, to $t_3$) requirement for the synchronized DATA to reach gated clock splitter circuit 400. Returning to FIG. 5A, the L1 latch output from SRL 418 is applied as a gate signal BCLKGT into AND gate 402 at time $t_4$ while the L2 latch output from SRL 418 is applied as a gate signal CCLKGT into AND gate 414 at time $t_5$, resulting in BCLK and CCLK being properly synchronized with the corresponding OSC signals ZB1 and ZC1 at times $t_5$ and $t_6$, respectively. In accordance with the depicted embodiment, wherein gating signals BCLKGT and CCLKGT are generated from the L1 and L2 outputs, respectively, of SRL 418, the gated signal sequence begins with BCLK from time $t_5$ to $t_6$, and terminates with CCLK from time $t_6$ to $t_7$. With reference to FIG. 6, there is depicted a clock repowering tree 615 and a clock gate repowering tree 610 in accordance with a preferred embodiment of the present invention. Exemplary functional SRLs such as may be clocked by BCLK and CCLK of FIG. 4A are depicted as leaf node SRLs 612 and 614.

Clock gate repowering tree 610 provides a balanced power up and power down capability for clock gating circuits. As illustrated in FIG. 6, the a pair of gated clock splitters 606 and 608 include the SRL functionality described with respect to SRLs 416 and 418 in FIG. 4A. Gated latch control signals BCLK and CCLK are generated at the output of each of gated clock splitters 606 and 608 for synchronously starting and stopping functional leaf node SRLs 612 and 614.

Figure 4B:
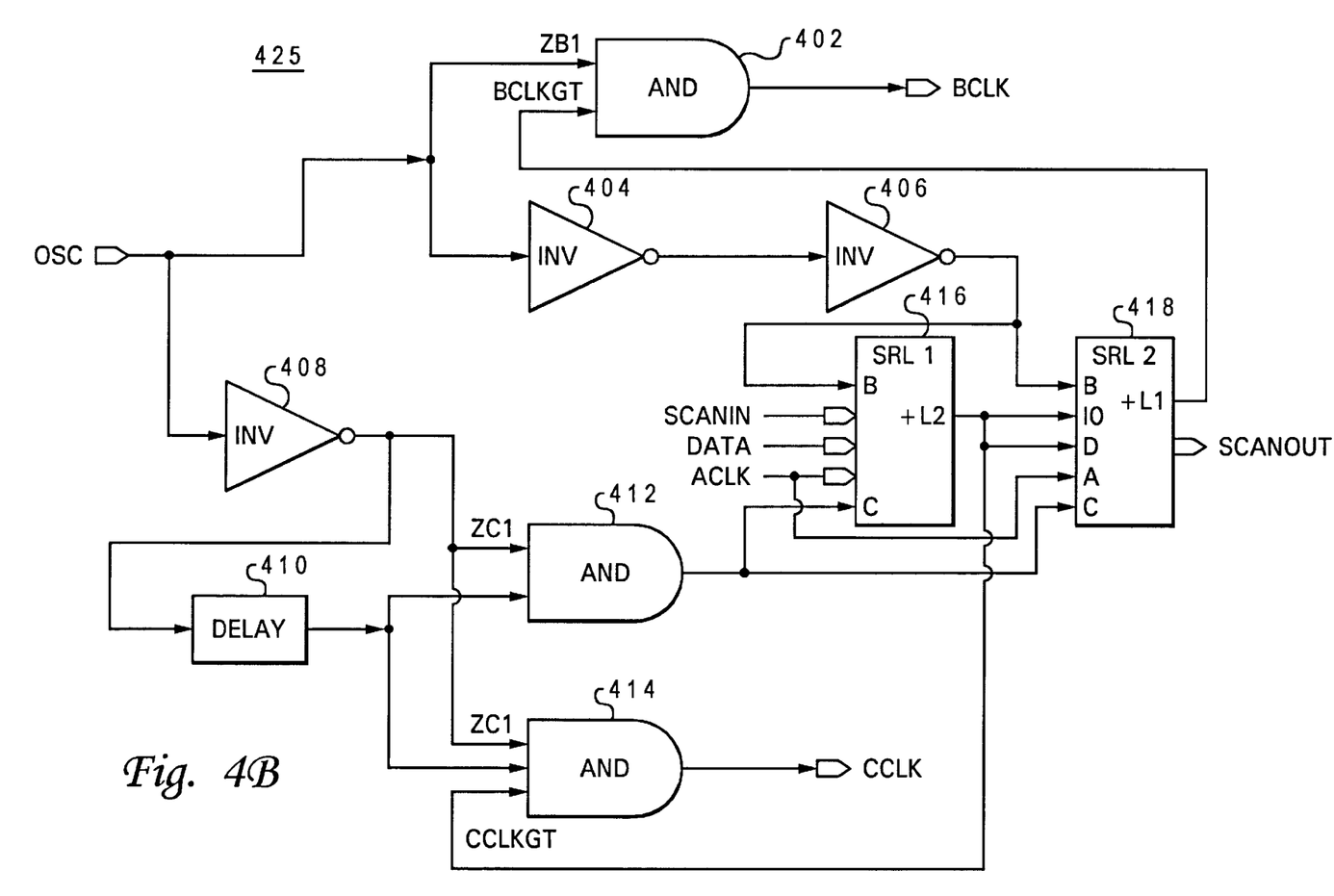
FIG. 4B illustrates a circuit for providing a second gated output timing signal in accordance with a second embodiment of the present invention.

With reference to FIG. 4B, there is illustrated a gated clock splitter 425 for providing an alternative gated output timing signal sequence in accordance with a second embodiment of the present invention. As with gated clock splitter 400, a common OSC input feeds both the clock splitter that is utilized to generate the timing signals for clock gate formation as well as the splitter that clocks the functional SRLs. As illustrated in FIG. 4B, gated clock splitter 425 is configured similarly to gated clock splitter 400 with the exception of the means for generating gating signal CCLKGT. Referring back to FIG. 4A, CCLKGT is generated within gated clock splitter 400 at the L2 output of SRL 418 from while gating signal BCLKGT is generated at the L1 output of SRL 418. The result of this arrangement is that, as depicted in FIG. 5A, is a gate signal sequence in which gated latch control signal CCLK is asserted following the assertion of gated latch control signal BCLK.

Figure 5B:
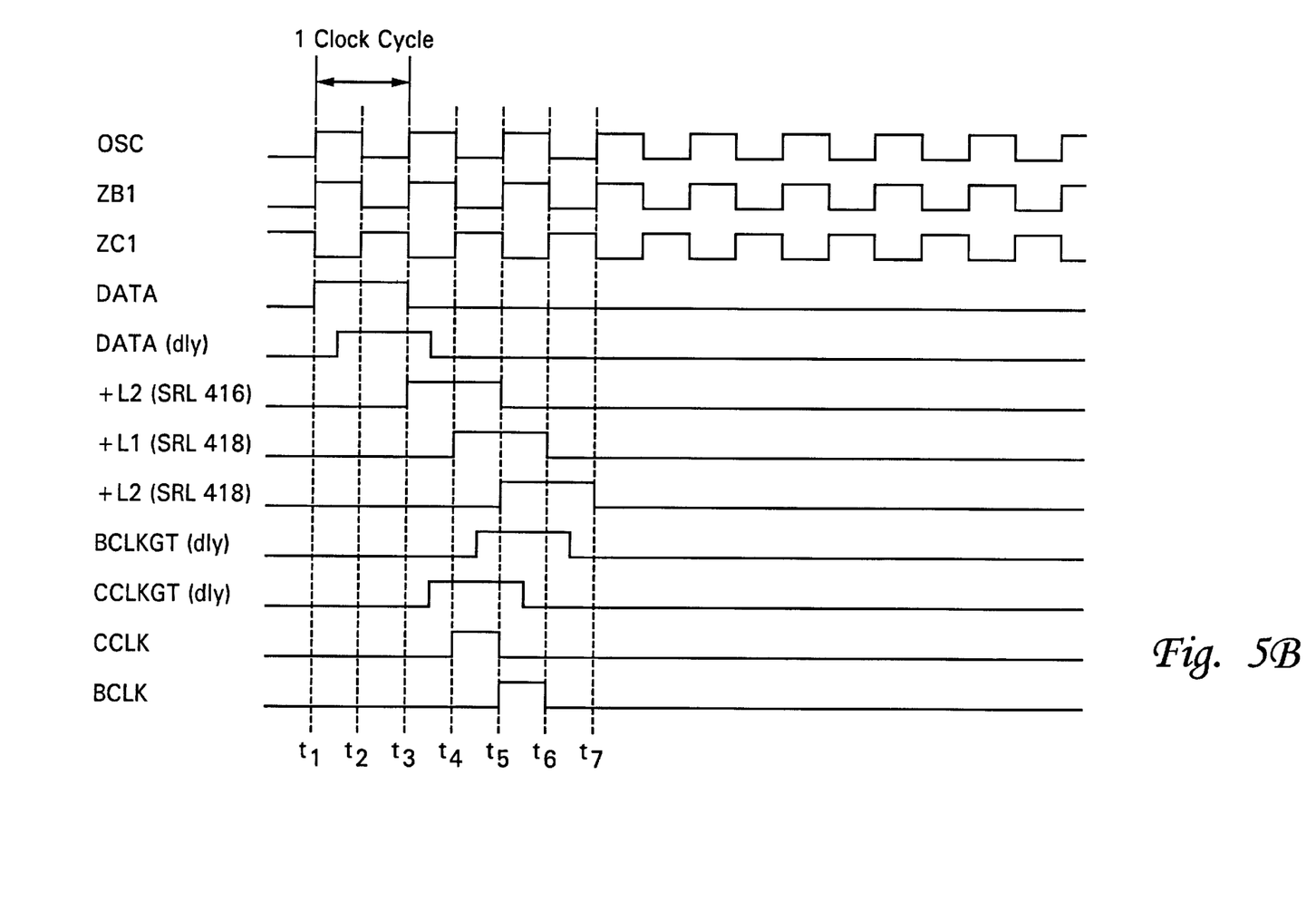
FIG. 5B is a timing diagram depicting the operation of the gated clock splitter circuit in FIG. 4B.

As illustrated in FIG. 4B, gating signal CCLKGT is generated at the L2 output of SRL 416 while gating signal BCLKGT is generated at the L1 output of SRL 418. This results in gated latch control signal CCLK being asserted prior to assertion of gated latch control signal BCLK (see timing diagram in FIG. 5B).

Figure 4C:
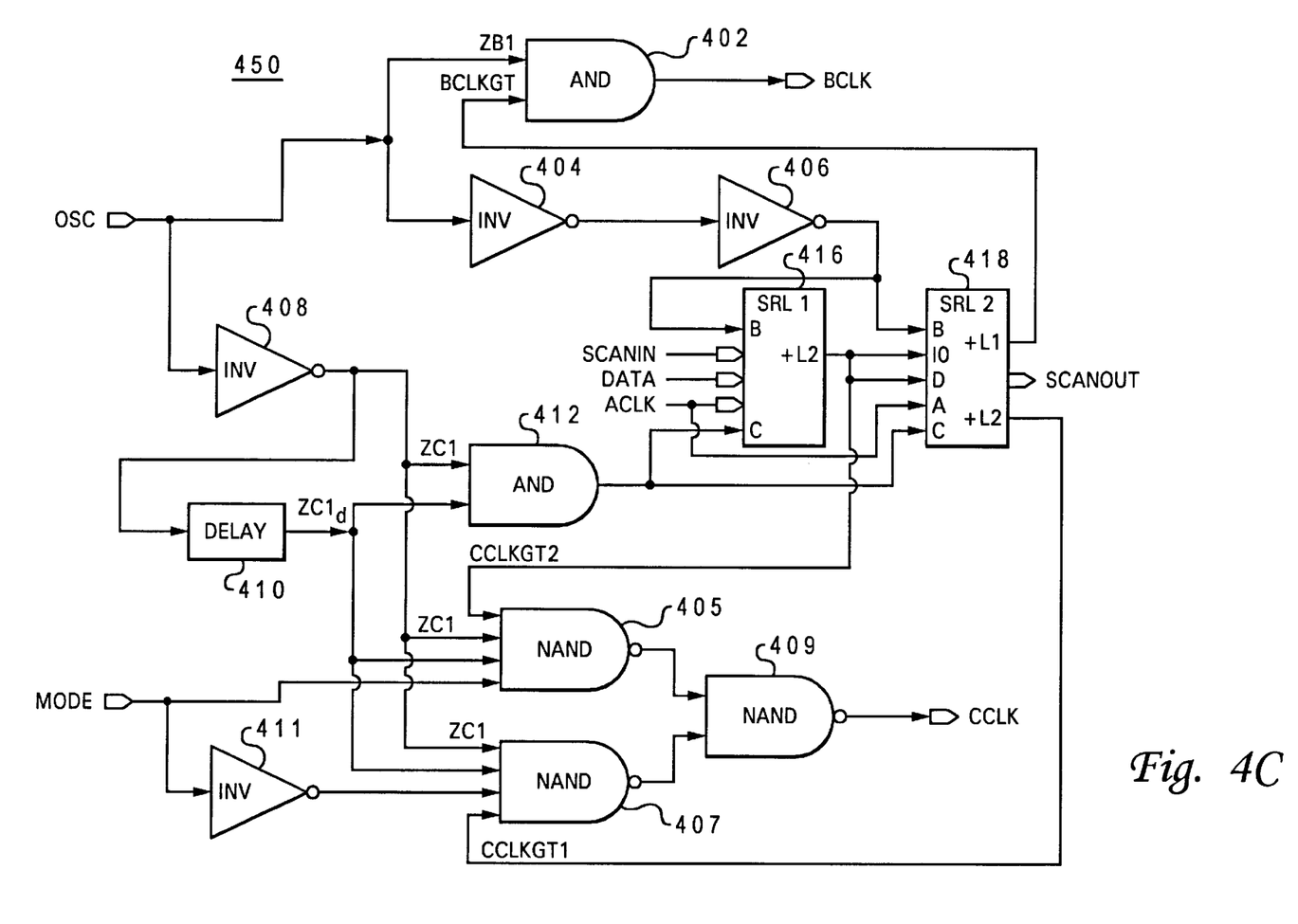
FIG. 4C depicts a circuit for selectively alternating between the first and second gated output timing signals in accordance with a third embodiment of the present invention.

Referring to FIG. 4C, there is depicted a gated clock splitter 450 for selectively alternating between the two gated output timing signal sequences provided by gated clock splitters 400 and 425 in accordance with a third embodiment of the present invention. In accordance with the depicted embodiment, gated clock splitter 450 includes an additional logic block comprising NAND gates 405, 407, and 409, and an inverter 411, which together provide a means for switching between a first timing signal sequence wherein gated latch control signal CCLK follows gated latch control signal BCLK and a second timing signal sequence wherein gated latch control signal CCLK precedes gated latch control signal BCLK.

Figure 5C:
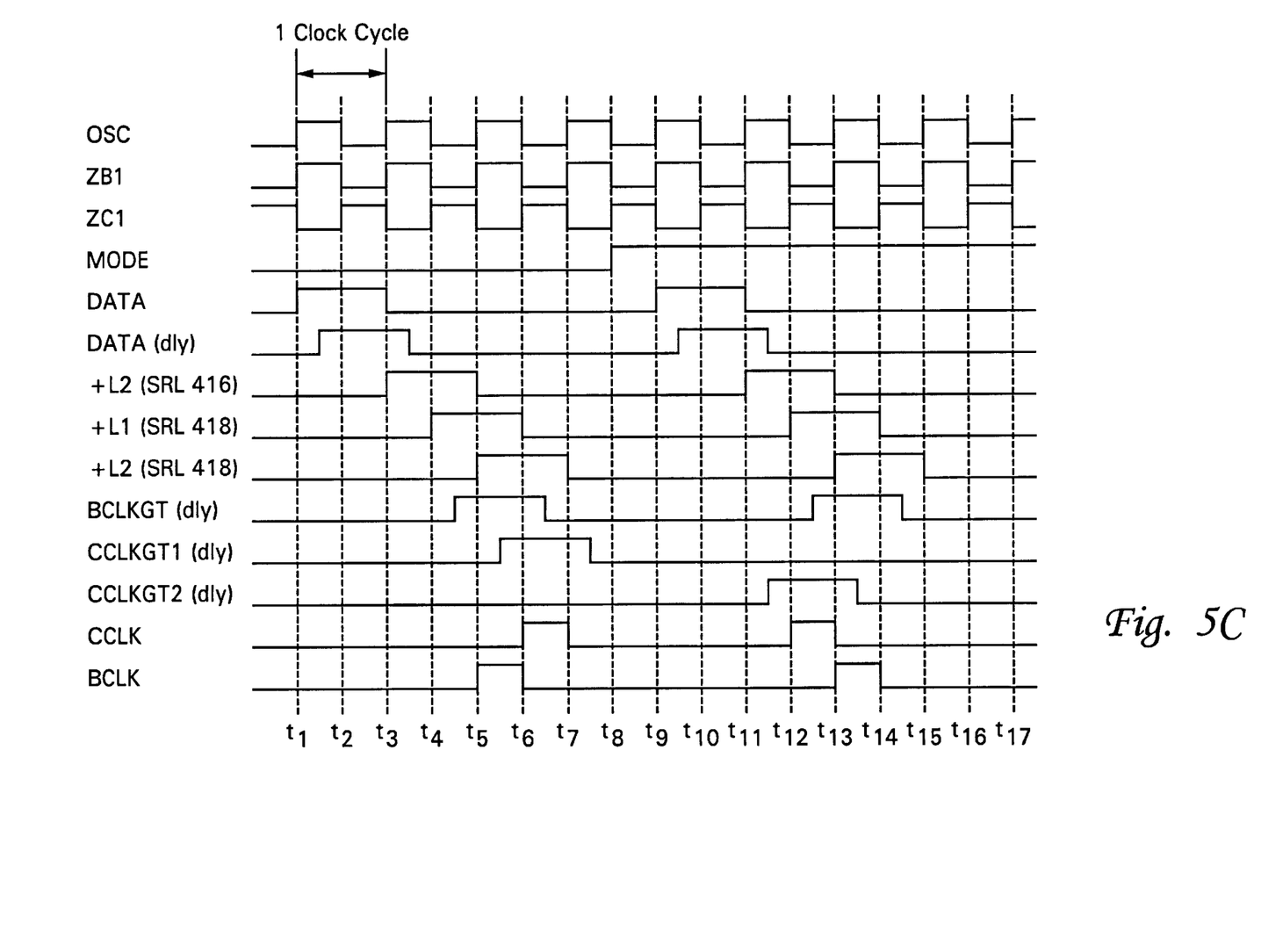
FIG. 5C is a timing diagram illustrating the operation of the gated clock splitter circuit in FIG. 4C.

The timing of gated latch control signal CCLK with respect to the timing of gated latch control signal BCLK is controllably switched in accordance with a MODE signal applied to NAND gate 405 directly and to NAND gate 407 through inverter 411. The other inputs into NAND gate 407 include ZC1, delayed ZC1 (ZC1d), and the L2 output of SRL 418. When MODE is at a logic low, the MODE input into NAND gate 405 is deasserted while the inverted MODE input into NAND gate 407 is asserted. In such a configuration, a first gating signal, CCLKGT1, applied from the L2 output of SRL 418 into NAND gate 407 controls the gating of gated latch control signal CCLK. As illustrated in the timing diagram of FIG. 5C, when MODE is de-asserted, the delayed gating signal labeled CCLKGT1(dly) (resulting from the asserted L2 output of SRL 418 at time $t_5$) provides synchronous switching of gated latch control signal CCLK with ZC1 at time $t_6$. Thus, while MODE is de-asserted gated clock splitter 450 is functionally equivalent to gated clock splitter 400 depicted in FIG. 4A.

In addition to a MODE signal input, NAND gate 405 receives as inputs ZC1, ZC1$_d$, and the L2 output of SRL 416. When MODE is asserted to a logic level high, the MODE input into NAND gate 407 is de-asserted while the inverted MODE input into NAND gate 405 is asserted. In this configuration, a second gating signal, CCLKGT2, applied from the L2 output of SRL 416 into NAND gate 405 controls the gating of gated latch control signal CCLK. As illustrated in the timing diagram of FIG. 5C, when MODE is asserted, the delayed gating signal labeled CCLKGT2(dly) (resulting from the asserted L2 output of SRL 416 at time $t_{11}$) provides synchronous switching of gated latch control signal CCLK with ZC1 at time $t_{12}$. Thus, while MODE is asserted gated clock splitter 450 is functionally equivalent to gated clock splitter 425 depicted in FIG. 4B.

While the invention has been particularly shown and described with reference to a preferred embodiment, it will be understood by those skilled in the art that various changes in form and detail may be made therein without departing from the spirit and scope of the invention.

What is claimed is:

1. A circuit for providing a gated output timing signal, said circuit comprising:
   a timing signal input providing a timing signal;
   a complementary timing signal input providing a complementary timing signal;
   gating logic that gates a timing signal from said signal input, wherein said gating logic includes a gating signal input, wherein said gating logic comprises:
      a first combinatorial logic block coupled to said timing signal input that generates a first gated timing signal; and
      a second combinatorial logic block coupled to said complementary timing signal input that generates a second gated timing signal; and
   circuit means for providing a gate signal to said gating logic, wherein said circuit means provides a full-cycle path for said gate signal to said gating signal input, said circuit means for providing a gate signal to said gating logic including a pair of serially coupled shift register latches, wherein each of said pair of shift register latches includes a first latch control input receiving said timing signal from said timing signal input and a second latch control input receiving said complementary timing signal from said complementary timing signal input, said pair of shift register latches generating a first gate signal for gating said first combinatorial logic block and a second gate signal for gating said second combinatorial logic block.

2. The circuit of claim 1, wherein each of said pair of shift register latches comprises a first latch having a first control input and a second latch having a second control input, said circuit means for providing a gate signal to said gating logic further comprising combinatorial logic coupled between said timing signal and complementary timing signal inputs and said first and second control inputs of said pair of shift register latches for providing phase separation between signals applied to said first and second control inputs.

3. The circuit of claim 2 wherein said combinatorial logic coupled between said timing signal and complementary signal inputs and said first and second control inputs of said pair of shift register latches includes:
   a pair of inverters serially coupled between said timing signal input and said first control input,
   an inverter coupled between said complementary timing signal input and a first AND gate, wherein the output of said first AND gate is coupled to said second control input; and
   a delay element coupled between the output of said inverter and said first AND gate.

4. The circuit of claim 1, wherein said first combinatorial logic block includes a first logic gate that combines said timing signal from said timing signal input with said first gate signal to generate said first gated timing signal, and wherein said second combinatorial logic block includes a second logic gate that combines said complementary timing signal from said complementary timing signal input with said second gate signal to generate a second gated timing signal.

5. The circuit of claim 4, wherein said first logic gate and said second logic gate are AND or NAND gates.

6. The circuit of claim 1, wherein said first and second gated timing signals are applied as clock inputs to a third shift register latch, and wherein said pair of serially coupled shift register latches provide a positive or a negative half-cycle delay between said first and second gate signals, such that said first gated timing signal is half-cycle delayed with respect to said second gated timing signal for starting and stopping said third shift register latch.

7. The circuit of claim 6, wherein each of said pair of serially coupled shift register latches includes an L1/L2 latch pair comprising an L1 latch having an L1 latch output and a L2 latch having an L2 latch output, wherein said first gate signal is provided at the L1 latch output of the second of said pair of serially coupled shift register latches, said circuit further comprising:
   a mode signal input; and
   a mode switch logic block that receives the L2 latch outputs of each of said pair of serially coupled shift registers and selects one of said L2 latch outputs to be applied to said second combinatorial logic block to effectuate a positive or a negative half-cycle delay between said first and second gated timing signals in accordance with the logic level of said model signal input.

8. The circuit of claim 7, wherein said mode switch logic block comprises:
   a first mode switch logic gate that receives as inputs, said mode signal input and the L2 latch output from the L2 latch within the first serially coupled shift register latch, and generates a first mode control signal in response thereto;
   a second mode switch logic gate that receives as inputs, the complement of said mode signal input and the L2 latch output from the L2 latch within the second serially coupled shift register latch, and generates a second mode control signal in response thereto; and
   a third mode switch logic gate that generates said second gated timing signal as a logical combination of said first and second mode control signals.

9. The circuit of claim 8, wherein said first, second, and third mode switch logic gates are NAND gates.

10. A splitter circuit for providing a gated complementary output timing signal, said splitter circuit comprising:
    a timing signal input providing a timing signal;
    a complementary timing signal input providing a complementary timing signal;
    a first combinatorial logic block coupled to said timing signal input that generates a gated timing signal;
    a second combinatorial logic block coupled to said complementary timing signal input that generates a gated complementary timing signal; and
    circuit means for providing gate signals to said first and second combinatorial logic blocks, wherein said circuit means provides a full-cycle path to said gating signal input, said circuit means including a pair of shift register latches each receiving a first latch control signal and a second latch control signal, wherein said pair of shift register latches generate a first gate signal for gating said first combinatorial logic block and a second gate signal for gating said second combinatorial logic block.

11. The splitter circuit of claim 10, wherein each of said pair of shift register latches comprises an L1/L2 latch pair each having a first control input coupled to said timing signal input and a second control input coupled to said complementary signal input, said splitter circuit further comprising:

combinatorial logic coupled between said timing signal input and said first latch control input and between said complementary timing signal input and said second latch control input for providing shift control timing between said first latch control input and said second latch control input.

12. The splitter circuit of claim 11, wherein said combinatorial logic coupled between said timing signal input and said first latch control input includes:

a pair of inverters serially coupled between said timing signal input and said first latch control input;

and wherein said combinatorial logic coupled between said complementary timing signal input and said second latch control input includes;

an AND gate receiving said complementary timing signal input at a first input and having an output coupled to said second latch control input; and a delay element coupled between said complementary timing signal input and a second input of said AND gate.

13. The splitter circuit of claim 10, wherein said first combinatorial logic block includes a first logic gate that combines said timing signal from said timing signal input with said first gate signal to produce a first gated timing signal, and wherein said second combinatorial logic block includes a second logic gate that combines said complementary timing signal from said complementary timing signal input with said second gate signal to produce a second gated timing signal.

14. The splitter circuit of claim 13, wherein said first logic gate and said second logic gate are AND or NAND gates.

15. The splitter circuit of claim 10, further comprising a data input to said pair of shift register latches, wherein said data input controls gating of said first and second combinatorial logic blocks.

* * * * *

UNITED STATES PATENT AND TRADEMARK OFFICE
CERTIFICATE OF CORRECTION

PATENT NO. : 6,448,835 B1
DATED : September 10, 2002
INVENTOR(S) : Steven Michael Douskey and Bruce George Rudolph It is certified that error appears in the above-identified patent and that said Letters Patent is hereby corrected as shown below:

Column 7,
Line 19, "from said signal" should be -- from said timing signal --.

Signed and Sealed this

Seventeenth Day of December, 2002

JAMES E. ROGAN
*Director of the United States Patent and Trademark Office*